United States Patent [19]
Seto et al.

[11] Patent Number: 6,101,089
[45] Date of Patent: Aug. 8, 2000

[54] ELECTRONIC APPARATUS

[75] Inventors: Masaru Seto; Atsushi Tatemichi, both of Tokyo, Japan

[73] Assignee: Kabushiki Kaisha Toshiba, Kawasaki, Japan

[21] Appl. No.: 09/055,945

[22] Filed: Apr. 7, 1998

[30] Foreign Application Priority Data

May 7, 1997 [JP] Japan ................................. 9-116865

[51] Int. Cl.[7] .............................. H05K 7/02; H05K 9/00
[52] U.S. Cl. .................... 361/687; 361/683; 361/684; 361/800; 361/816; 174/796
[58] Field of Search .................... 361/684, 687, 361/683, 799, 800, 803, 753, 816, 818; 174/35 R, 736, 796, 250, 255, 261–263

[56] References Cited

U.S. PATENT DOCUMENTS

| | | | |
|---|---|---|---|
| 4,939,624 | 7/1990 | August et al. | 361/424 |
| 5,329,422 | 7/1994 | Sasaki | 361/686 |
| 5,331,508 | 7/1994 | Hosoi et al. | 361/680 |
| 5,627,730 | 5/1997 | Konig et al. | 361/784 |
| 5,748,451 | 5/1998 | Thompson et al. | 361/788 |
| 5,973,920 | 10/1999 | Altic et al. | 361/687 |

FOREIGN PATENT DOCUMENTS

| | | |
|---|---|---|
| 8-116195 | 5/1996 | Japan . |
| 8-250886 | 9/1996 | Japan . |
| 9-27690 | 1/1997 | Japan . |

*Primary Examiner*—Leo P. Picard
*Assistant Examiner*—Hung Van Duong
*Attorney, Agent, or Firm*—Finnegan, Henderson, Farabow, Garrett & Dunner, L.L.P.

[57] ABSTRACT

A printed circuit board, a heat radiating shield plate formed of a metallic plate, a printed circuit board and a shield plate are arranged in a base section of a apparatus body in a stacked state. Studs made of a metal projects from the heat radiating shield plate. Both ends of each of the studs come in contact with ground areas of the printed circuit boards and are electrically connected to these ground areas. A CPU mounted on one of the printed circuit boards comes in contact with the heat radiating shield plate through a cool sheet and is thermally connected to the heat radiating shield plate.

15 Claims, 3 Drawing Sheets

ELECTRONIC APPARATUS

BACKGROUND OF THE INVENTION

The present invention relates to an electronic apparatus such as a personal computer, a word processor, a portable information terminal.

For example, the electronic apparatus such as a personal computer of a portable type, etc. has a housing. In the housing are arranged a printed circuit board mounting many electronic parts thereon and drive units such as a floppy disk drive, a hard disk drive, etc. The electronic parts and the drive units include heating parts for generating heat, or radio wave generating parts for generating radio waves.

When the interior of the housing rises in temperature by the heat generated from such heat generating parts, there is a fear that an error in operation of the electronic apparatus or damage of the electronic parts is caused. Further, the radio waves generated from the radio wave generating parts have a bad influence on other devices.

Therefore, a heat radiating plate is generally arranged in the vicinity of the heat generating parts in the electronic apparatus so that the heat is diffused and the rise in temperature of the interior of the housing is restrained. Further, with respect to the radio wave generating parts, a shield plate is arranged to prevent the radio waves from being externally leaked.

However, in the above-mentioned conventional electronic apparatus, measures for radiating heat and for shielding radio wave are independently taken. For example, both the heat radiating plate and the shield plate are arranged within the housing. Therefore, problems exist in that a mounting area within the housing is greatly occupied by the heat radiating plate and the shield plate, and the number of parts and manufacturing cost of the electronic apparatus are increased.

BRIEF SUMMARY OF THE INVENTION

The present invention has been contrived in consideration of the above circumstances and its object is to provide an electronic apparatus which is capable of enlarging a mounting area and reducing the number of parts and manufacturing cost.

To achieve the object, an electronic apparatus according to the present invention comprises: an apparatus body; a plurality of printed circuit boards arranged in the apparatus body so as to oppose to each other with predetermined intervals, each of the printed circuit board having ground areas exposed to a surface of the printed circuit board; and a conducting member arranged between the printed circuit boards, brought into contact with each of the ground areas of the printed circuit boards and electrically connecting the grounds of the printed circuit boards to each other, the printed circuit boards and the conducting member being fastened together to the apparatus body by plural screws.

The screws are respectively inserted and screwed into through holes coaxially formed in the ground area of each printed circuit board and the conducting member.

With the electronic apparatus having the above construction, the ground areas of the plural printed circuit boards are electrically connected to each other through the conducting member so that the grounds of the printed circuit boards are conducted to each other and are strengthened. The plural printed circuit boards and the conducting member are fastened together by the common screws.

An electronic apparatus according to the present invention comprises an apparatus body; a plurality of printed circuit boards arranged in the apparatus body to oppose each other with predetermined intervals, respectively having ground areas exposed to surfaces of the printed circuit boards, and mounted with a plurality of electronic parts; a metallic plate arranged between the printed circuits boards so as to oppose at least one of the electronic parts on the printed circuit boards, for radiating heat from the electronic part and shielding radio waves from the electronic part; and a conducting member fixed to the metallic plate, brought into contact with each of the ground areas of the printed circuit boards, and electrically connecting the grounds of the plural printed circuit boards to each other.

Further, an electronic apparatus according to the present invention comprises: an apparatus body; a keyboard arranged on the apparatus body; a display unit rotatably mounted on the apparatus body; a plurality of printed circuit boards arranged in the apparatus body to oppose each other with predetermined intervals, respectively having ground areas exposed to surfaces of the printed circuit boards, and mounted with a plurality of electronic parts on the surfaces; a metallic plate arranged between the printed circuits boards so as to oppose at least one of the electronic parts on the printed circuit boards, for radiating heat from the electronic part and shielding radio waves from the electronic part; and a conducting member fixed to the metallic plate, brought into contact with each of the ground areas of the printed circuit boards, and electrically connecting the grounds of the plural printed circuit boards to each other.

According to the electronic apparatus constructed above, heat generated from the electronic part is radiated to the metallic plate and is further diffused to the plural printed circuit boards through the conducting member. Further, the grounds of the plural printed circuit boards are connected to each other through the conducting member and are strengthened. Thus, noises generated from the electronic part can be shielded by the metallic plate. Accordingly, heat radiating effects and shielding effects can be shown by the single metallic plate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 4 show a personal computer according to an embodiment of the present invention, in which:

FIG. 1 is a perspective view of the personal computer,

FIG. 2 is an exploded perspective view showing a base section of the personal computer, printed circuit boards arranged within this base section, etc., FIG. 3 is a cross-sectional view showing an essential part of the personal computer, and FIG. 4 is a side view enlargedly showing a stud arranged within the base section.

DETAILED DESCRIPTION OF THE INVENTION

An embodiment of the present invention applied to a personal computer of a book type will be explained in detail with reference to the drawings.

Figure 1:
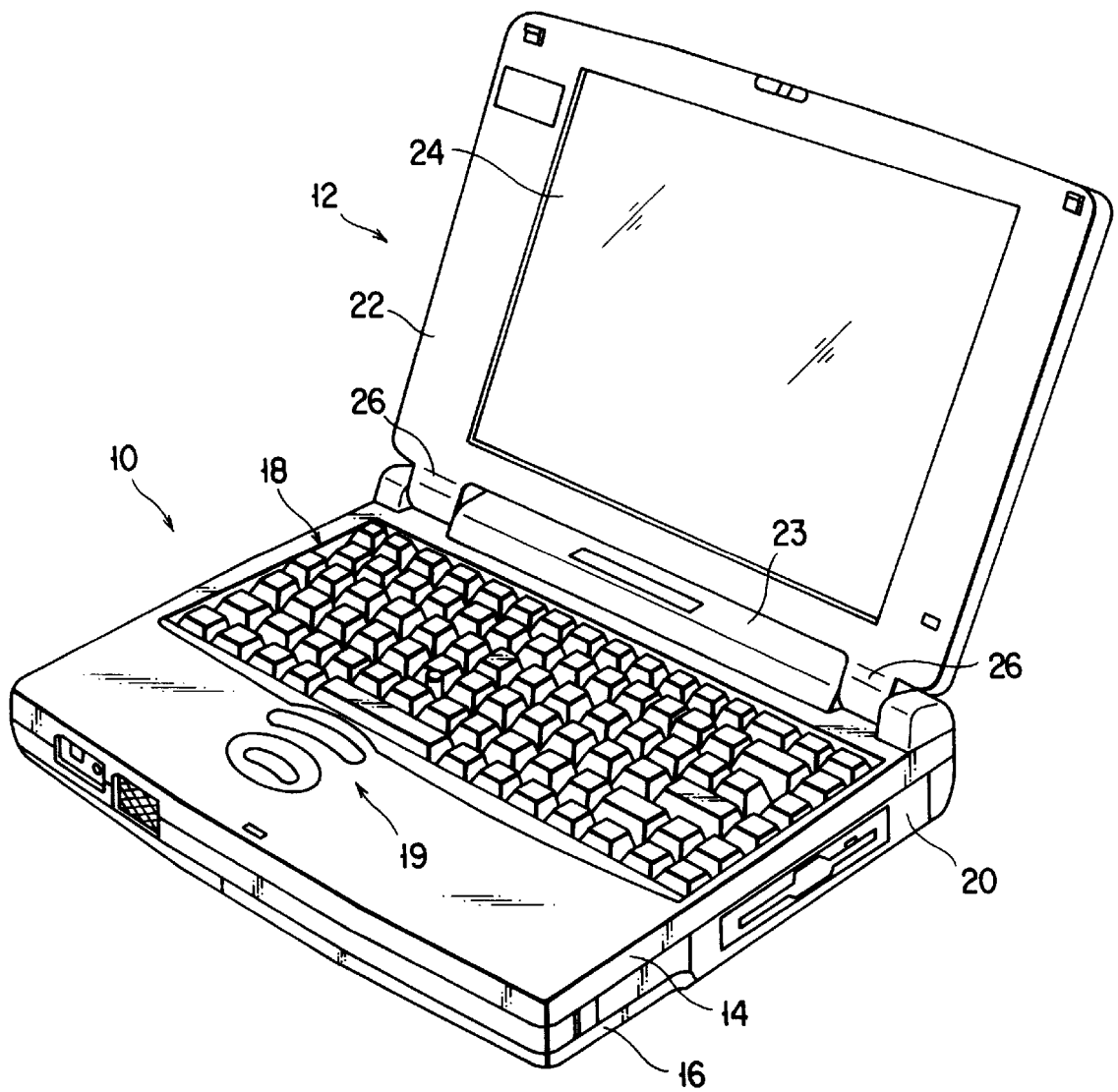

As shown in FIG. 1, a personal computer functioning as an electronic apparatus comprises an apparatus body 10 formed in a flat rectangular shape and a display unit 12 mounted on the apparatus body such that it can be freely opened and closed.

The apparatus body 10 is constructed by a rectangular base section 16 having an opened top, and a cover section 14 fitted to the base section and covering the opened top of the base section. A keyboard 18, a click switch 19, etc. are arranged on an upper face of the apparatus body 10. A floppy disk drive 20, a hard disk drive (not shown), printed circuit boards described later, etc. are arranged within the apparatus body 10. Plural convex portions 23 are formed on the rear end portion of the upper face of the apparatus body 10.

The display unit 12 has a display housing 22 formed in a flat rectangular box shape corresponding to the shape of the apparatus body 10 and also has a liquid crystal display panel 24 stored in the display housing. The display unit 12 has a pair of leg portions 26 projecting from a rear end portion of the display housing 22. These leg portions 26 are rotatably supported by the convex portions 23 of the apparatus body 10 through hinges (not shown).

Thus, the display unit 12 is rotatable between a closed position and an opened position shown in FIG. 1. In the closed position, the display unit 12 overlaps the upper face of the apparatus body 10 and covers the keyboard 18. In the opened position, the display unit 12 is rotated upward so that the keyboard 18 and the liquid crystal display panel 24 are exposed.

Figure 2:
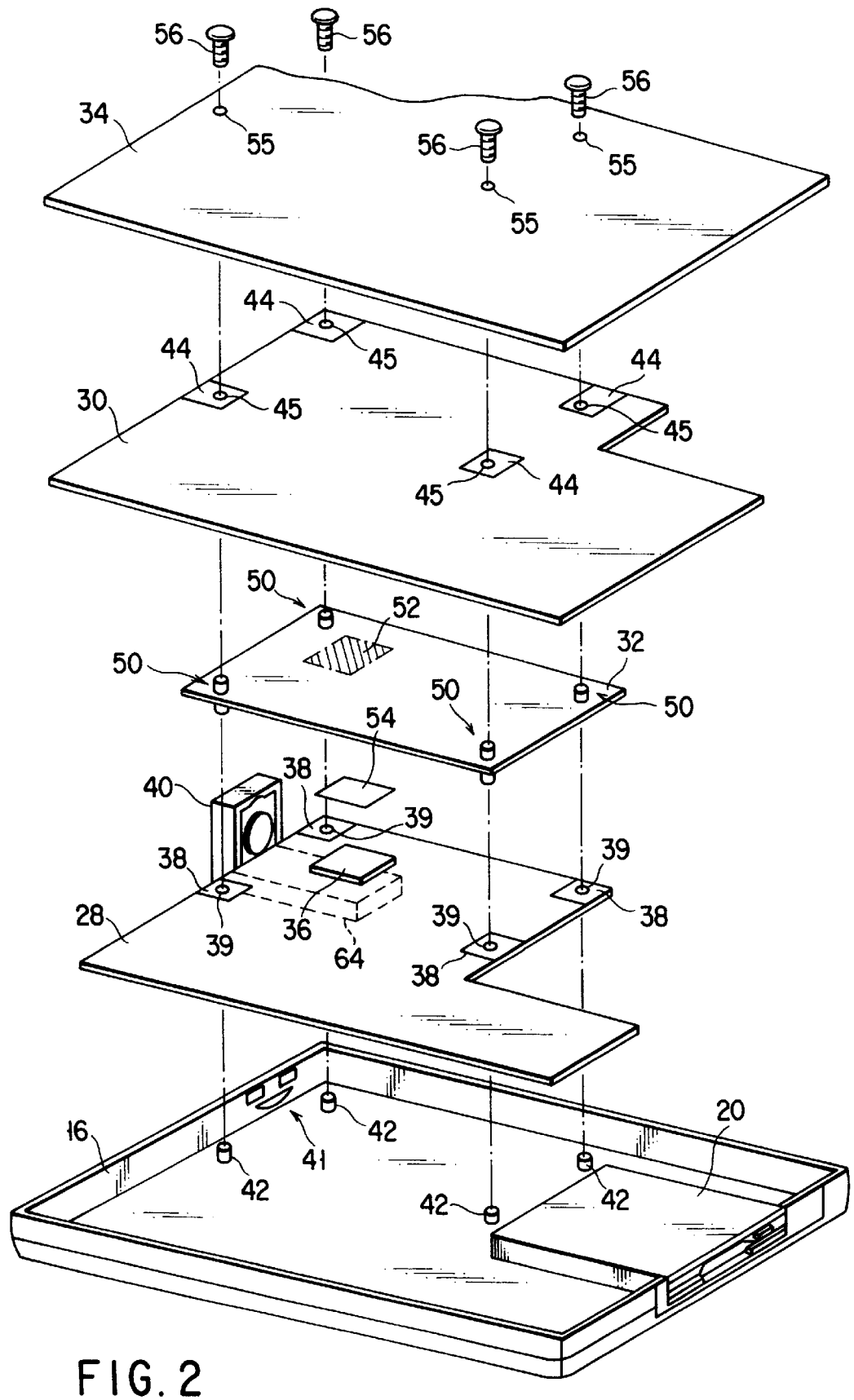
Figure 3:
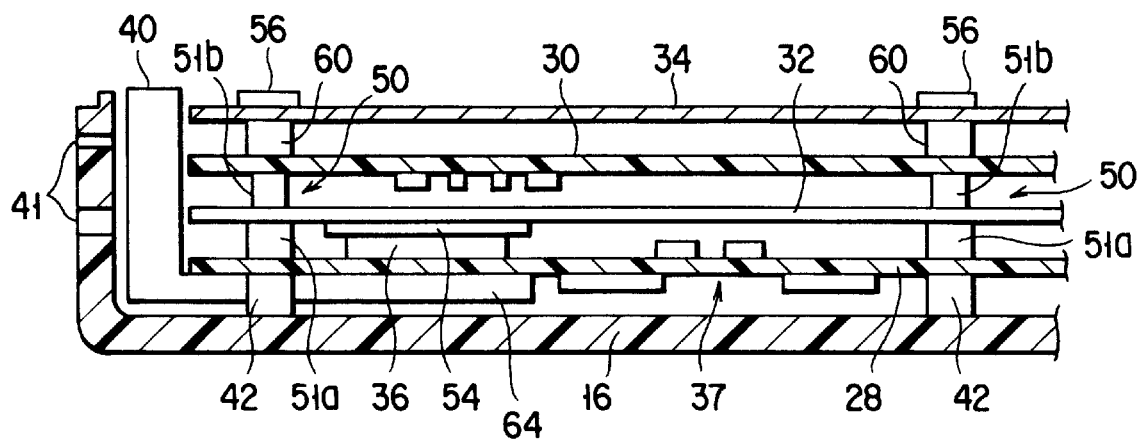

As shown in FIGS. 2 and 3, two printed circuit boards 28 and 30, a heat radiating shield plate 32 and a shield plate 34 are arranged in the base section 16 of the apparatus body 10 in a stacked manner.

On surfaces of the printed circuit board 28 are mounted an electronic part having a large heating amount, e.g., a CPU 36 and other many electronic parts. Further, a plurality of ground areas, e.g., four ground areas 38 are exposed to the upper face of the printed circuit board 28, and a through hole 39 is formed in each of the ground areas 38.

Similarly, many electronic parts are mounted on the surface of the other printed circuit board 30. A plurality of ground areas, e.g., four ground areas 44 are exposed to both surfaces of the printed circuit board 30. A through hole 45 is formed in each of the ground areas 44. These ground areas 44 are arranged in the same positional relationship as the ground areas 38 of the printed circuit board 28. Each of the through hole 45 is arranged in alignment with the corresponding through hole 39 on the printed circuit board 28.

The heat radiating shield plate 32 located between the printed circuit boards 28 and 30 is formed of a metal having high conductivity and heat transfer rate, e.g., a rectangular metallic plate made of aluminum. A stud 50 functioning as a conducting member is fixed to each of four corners of the heat radiating shield plate 32. Each stud 50 is formed of a metal such as copper having high conductivity and heat transfer rate.

Figure 4:
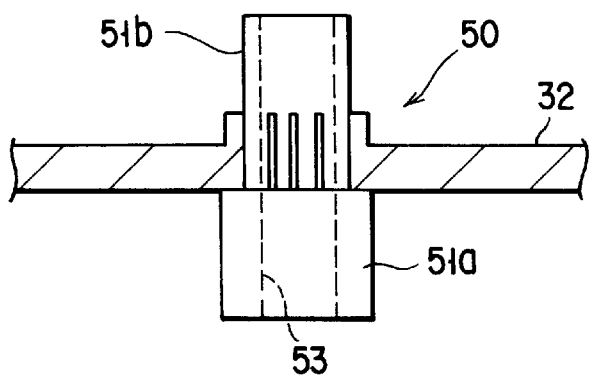

As shown in FIG. 4, each stud 50 is formed in a stepped cylindrical shape and is fixed to the heat radiating shield plate 32 in a press-fitting state. A large diameter portion of the stud 50 vertically extends from a lower surface of the heat radiating shield plate 32 and defines a first conducting portion 51a. A small diameter portion of the stud 50 vertically extends from an upper surface of the heat radiating shield plate 32 and defines a second conducting portion 51b. An inner hole (through hole) 53 of the stud 50 extends perpendicular to the heat radiating shield plate 32 and is opened on both ends of the stud.

The four studs 50 are arranged in the same position relations as the ground areas 38, 44 of the printed circuit boards 28, 30. Both the end faces of the studs are flatly formed in close contact with the ground areas. Further, the inner hole 53 of each stud 50 is coaxially aligned with each of the through holes 39 and 45 of the corresponding ground areas 38 and 44.

As shown in FIGS. 2 and 3, the shield plate 34 is formed in a rectangular shape having a size for covering the opened top of the base section 16. Four through holes (only three through holes are shown in the drawings) 55 are formed in the shield plate 34. These through holes 55 are arranged in the same positional relation as the through holes 45 of the printed circuit board 30.

These printed circuit boards 28, 30, the heat radiating shield plate 32 and the shield plate 34 are commonly fastened to the base section 16 by four screws 56 in a stacked state. Specifically, as shown in FIGS. 2 and 3, four bosses 42 are formed on the inner surface of a bottom wall of the base section 16 and a threaded hole is formed in each of the bosses. The printed circuit board 28 located in a lowermost position is arranged on the bosses 42 in a state in which the through holes 39 are aligned with the threaded holes of the respective bosses 42.

The heat radiating shield plate 32, the printed circuit board 30 and the shield plate 34 are sequentially overlapped and arranged on this printed circuit board 28. In this case, the heat radiating shield plate 32, the printed circuit board 30 and the shield plate 34 are arranged such that the inner hole 53 of each stud 50 and the corresponding through holes 44 and 55 are coaxially aligned with one another. Each screw 56 is screwed from a side of the shield plate 34 into the threaded hole of each boss 42 through the through holes 55, 45, the inner hole 53 of the stud 50 and the through hole 39 of the printed circuit board 28. Thus, the printed circuit boards 28, 30, the heat radiating shield plate 32 and the shield plate 34 are fastened together to the base section 16.

In the fixed state, the heat radiating shield plate 32 is located between the two printed circuit boards 28 and 30 in parallel with one another at predetermined distances. The heat radiating shield plate 32 is also opposed to the CPU 36 as heating parts. A contact portion 52 of the heat radiating shield plate 32 comes in contact with the CPU 36 through a cool sheet 54 so that the contact portion 52 is thermally connected to the CPU 36.

The first conducting portion 51a of each stud 50 fixed to the heat radiating shield plate 32 comes in close contact with the corresponding ground area 38 of the printed circuit board 28 so that the first conducting portion 51a is electrically connected to the ground area 38. Simultaneously, the second conducting portion 51b of the stud 50 comes in close contact with the corresponding ground area 44 of the printed circuit board 30 so that the second conducting portion 51b is electrically connected to the ground area 44. Thus, the grounds of the upper and lower printed circuit boards 28, 30 are electrically connected to each other through the studs 50.

Four spacers 60 are arranged between the printed circuit board 30 and the shield plate 34, and the respective screws 56 are screwed through the spacers. A cooling fan 40 is attached to an end portion of the printed circuit board 28 and is opposed to the printed circuit boards 28, 30 and the heat radiating shield plate 32. A heat sink 64 is arranged between the printed circuit board 28 and the base section 16, and is oppositely adjacent to the CPU 36. For example, this heat sink 64 is formed by aluminum integrally with a frame of the cooling fan 40. Further, air discharge holes 41 are formed in a side wall of the base section 16 and opposed to the cooling fan 40.

According to the personal computer constructed above, the two printed circuit boards 28, 30, the heat radiating shield plate 32 and the shield plate 34 are fixed to the base section 16 by the common screws 56. Therefore, it is possible to reduce the number of screws, improve an assembly property and reduce manufacturing cost. Simultaneously, the ground areas 38, 44 of the two printed circuit boards 28, 30 are electrically connected to each other through the studs 50 so that the ground of the computer is strengthened and electric stability can be improved. Thus, shield effects with respect to radio waves and noises generated from electronic parts are improved.

Further, the CPU 36 mounted on the printed circuit board 28 comes in contact with the heat radiating shield plate 32 through the cool sheet 54. Therefore, heat from the CPU 36 is radiated to the heat radiating shield plate 32 and is further diffused to the two printed circuit boards 28, 30 through the four studs 50. The heat of the CPU 36 is also radiated through the heat sink 64. Accordingly, cooling effects of heating parts (CPU 36) are improved and errors in operations of the heating parts and other electronic parts and their thermal damages can be effectively prevented.

The cooling effects and the shield effects mentioned above can be obtained by the single heat radiating shield plate 32 so that the number of parts and manufacturing cost can be reduced and a mounting area within the apparatus body 10 can be secured sufficiently.

Figure 5:
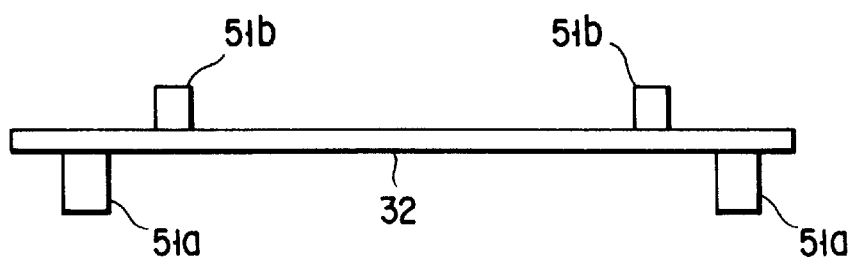
FIG. 5 is a side view schematically showing a heat radiating shield plate according to a modification of the present invention.

The present invention is not limited to the above-mentioned embodiment, but can be various modified within the scope of the present invention. For example, in the above embodiment, each stud 50 integrally has the first and second conducting portions 51a, 51b. However, as shown in FIG. 5, the first and second conducting portions 51a, 51b may be independently constructed and separately arranged. Further, the number of studs can be increased or decreased and the number of printed circuit boards can be also increased if necessary.

The number of electronic parts brought into contact with the heat radiating shield plate is not limited to one, but may be increased in accordance with necessity. The electronic parts contacting the heat radiating shield plate may be constructed by electronic parts mounted on separate printed circuit boards. Further, the present invention is not limited to a portable type personal computer, but can be also applied to other electronic apparatuses such as a word processor, a desk top type personal computer, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
   an apparatus body;
   a plurality of printed circuit boards arranged in the apparatus body to oppose each other with predetermined intervals and respectively having ground areas exposed to surfaces of the printed circuit boards; and
   a columnar conducting member arranged between the printed circuit boards, coming in contact with each of the ground areas of the printed circuit boards and electrically connecting the grounds of the printed circuit boards to each other;
   the printed circuit boards and the columnar conducting member being fastened together to the apparatus body by a plurality of screws.

2. An electronic apparatus according to claim 1, wherein the ground areas of the printed circuit boards and the conducting member respectively have through holes which are coaxially aligned with one another and to which the a screw is inserted.

3. An electronic apparatus comprising:
   an apparatus body;
   a plurality of printed circuit boards arranged in the apparatus body to oppose each other with predetermined intervals and respectively having ground areas exposed to surfaces of the printed circuit boards and a plurality of electronic parts mounted on the surfaces of the printed circuit boards;
   a metallic plate arranged between the printed circuit boards to oppose at least one of the electronic parts on the printed circuit boards, for radiating heat from said electronic part and shielding radio waves from said electronic part; and
   a conducting member fixed to the metallic plate and coming in contact with each of the ground areas of the printed circuit boards so as to electrically connect the grounds of the printed circuit boards to each other.

4. An electronic apparatus according to claim 3, wherein the printed circuit boards and the conducting member are fastened together to the apparatus body by screws.

5. An electronic apparatus according to claim 3, which further comprises a keyboard arranged on the apparatus body and a display unit rotatably mounted on the apparatus body.

6. An electronic apparatus according to claim 3, wherein the conducting member has a first conducting portion projecting from one surface of the metallic plate and coming in contact with the ground area of the printed circuit board opposed to said one surface, and a second conducting portion projecting from the other surface of the metallic plate and coming in contact with the ground area of the printed circuit boards opposed to said other surface.

7. The electronic apparatus according to claim 3, wherein the metallic plate comes in contact with said at least one of the electronic parts through a cool sheet.

8. The electronic apparatus according to claim 3, wherein the apparatus body has a bottom wall on which the printed circuit boards mounted,
   which further comprises a shield plate opposed to the bottom wall with the printed circuit boards being interposed between the bottom wall and the shield plate, and
   the shield plates being fastened to the bottom wall by screws together with the printed circuit boards and the conducting member.

9. An electronic apparatus according to claim 3, which further comprises a cooling fan arranged within the apparatus body, for flowing air through spaces between the printed circuit boards and the metallic plate and between the printed circuit boards and the base section.

10. An electronic apparatus according to claim 4, wherein the ground areas of the printed circuit boards and the conducting member respectively have through holes which are coaxially aligned with one another and through which the screw is inserted.

11. The electronic apparatus according to claim 6, wherein the first and second conducting portions are integrally formed and coaxially extend.

12. An electronic apparatus according to claim 9, which further comprises a heat sink arranged between the printed circuit boards and the base section, opposed to said at lease one electronic part through one of the printed circuit boards, and continued to the cooling fan.

13. An electronic apparatus comprising:

an apparatus body;

a plurality of printed circuit boards arranged in the apparatus body to oppose each other with predetermined intervals and respectively having ground areas exposed to surfaces of the printed circuit boards and a plurality of electronic parts mounted on the surfaces of the printed circuit boards;

a metallic plate arranged between the printed circuit boards to oppose at least one of the electronic parts on the printed circuit boards, for radiating heat from said electronic part and shielding radio waves from said electronic part; and a conducting member fixed to the metallic plate and coming in contact with each of the ground areas of the printed circuit boards so as to electrically connect the grounds of the printed circuit boards to each other, wherein the conducting member has a first conducting portion projecting from one surface of the metallic plate and coming in contact with the ground area of the printed circuit board opposed to said one surface, and a second conducting portion projecting from the other surface of the metallic plate and coming in contact with the ground area of the printed circuit boards opposed to said other surface.

14. An electronic apparatus comprising:

an apparatus body;

a plurality of printed circuit boards arranged in the apparatus body to oppose each other with predetermined intervals and respectively having ground areas exposed to surfaces of the printed circuit boards and a plurality of electronic parts mounted on the surfaces of the printed circuit boards;

a metallic plate arranged between the printed circuit boards to oppose at least one of the electronic parts on the printed circuit boards, for radiating heat from said electronic part and shielding radio waves from said electronic part, and wherein the metallic plate comes in contact with said at least one of the electronic parts through a cool sheet; and a conducting member fixed to the metallic plate and coming in contact with each of the ground areas of the printed circuit boards so as to electrically connect the grounds of the printed circuit boards to each other, wherein the conducting member has a first conducting portion projecting from one surface of the metallic plate and coming in contact with the ground area of the printed circuit board opposed to said one surface, and a second conducting portion projecting from the other surface of the metallic plate and coming in contact with the ground area of the printed circuit boards opposed to said other surface.

15. An electronic apparatus comprising:

an apparatus body;

a plurality of printed circuit boards arranged in the apparatus body to oppose each other with predetermined intervals and respectively having ground areas exposed to surfaces of the printed circuit boards and a plurality of electronic parts mounted on the surfaces of the printed circuit boards;

a metallic plate arranged between the printed circuit boards to oppose at least one of the electronic parts on the printed circuit boards, for radiating heat from said electronic part and shielding radio waves from said electronic part;

a conducting member fixed to the metallic plate and coming in contact with each of the ground areas of the printed circuit boards so as to electrically connect the grounds of the printed circuit boards to each other, wherein the conducting member has a first conducting portion projecting from one surface of the metallic plate and coming in contact with the ground area of the printed circuit board opposed to said one surface, and a second conducting portion projecting from the other surface of the metallic plate and coming in contact with the ground area of the printed circuit boards opposed to said other surface;

a cooling fan arranged within the apparatus body, for flowing air through spaces between the printed circuit boards and the metallic plate and between the printed circuit boards and the base section; and a heat sink arranged between the printed circuit boards and the base section, opposed to said at least one electronic part through one of the printed circuit boards, and continued to the cooling fan.

* * * * *

UNITED STATES PATENT AND TRADEMARK OFFICE
CERTIFICATE OF CORRECTION

PATENT NO. : 6,101,089
DATED : August 8, 2000
INVENTOR(S) : Masaru Seto et al.

It is certified that error appears in the above-identified patent and that said Letters Patent is hereby corrected as shown below:

Title Page, Item [57], in the Abstract,
Line 3, "a apparatus" should read --an apparatus--.

Claim 2, column 6,
Line 15, after "which the", delete "a".

Claim 8, column 6,
Line 55, "boards mounted" should read --boards are mounted--.

Claim 12, column 7,
Line 11, "at lease" should read --at least--.

Signed and Sealed this

Twelfth Day of June, 2001

*Attest:*

*Attesting Officer*

NICHOLAS P. GODICI
*Acting Director of the United States Patent and Trademark Office*